(12) United States Patent
Zaitsu et al.

(10) Patent No.: US 9,601,190 B2
(45) Date of Patent: Mar. 21, 2017

(54) SEMICONDUCTOR INTEGRATED CIRCUIT

(71) Applicant: KABUSHIKI KAISHA TOSHIBA, Tokyo (JP)

(72) Inventors: Koichiro Zaitsu, Kanagawa (JP); Kosuke Tatsumura, Kanagawa (JP); Masato Oda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/988,034

(22) Filed: Jan. 5, 2016

(65) Prior Publication Data
US 2016/0203866 A1    Jul. 14, 2016

(30) Foreign Application Priority Data
Jan. 9, 2015  (JP) ................................ 2015-003603

(51) Int. Cl.
*G11C 5/06*   (2006.01)
*G11C 13/00*  (2006.01)
(Continued)

(52) U.S. Cl.
CPC ...... *G11C 13/0002* (2013.01); *G11C 13/0038* (2013.01); *G11C 13/0069* (2013.01);
(Continued)

(58) Field of Classification Search
CPC ............ G11C 13/0026; G11C 2213/71; G11C 13/0002; G11C 13/0021; G11C 13/0023;
(Continued)

(56) References Cited

U.S. PATENT DOCUMENTS 8,531,866 B2   9/2013  Ikegami et al.
8,710,485 B2   4/2014  Saitoh et al.
(Continued)

FOREIGN PATENT DOCUMENTS

JP   2010-225194   10/2010
JP   2012-169023    9/2012
(Continued)

OTHER PUBLICATIONS

Noda, H., et al., "A Cost-Efficient High-Performance Dynamic TCAM With Pipelined Hierarchical Searching and Shift Redundancy Architecture", IEEE Journal of Solid-State Circuits, vol. 40, No. 1, pp. 245-253, (Jan. 2005).

*Primary Examiner* — Thong Q Le
(74) *Attorney, Agent, or Firm* — Finnegan, Henderson, Farabow, Garrett & Dunner LLP

(57) ABSTRACT

A semiconductor integrated circuit according to an embodiment includes: N ($\geq 1$) input wiring lines; M ($\geq 1$) output wiring lines; N first wiring lines corresponding to the N input wiring lines; K ($>M$) second wiring lines crossing the N first wiring lines; a plurality of first resistive change elements disposed at intersections of the first wiring lines and the second wiring lines, each of the first resistive change elements including a first electrode connecting to a corresponding one of the first wiring lines, a second electrode connecting to a corresponding one of the second wiring lines, and a first resistive change layer disposed between the first electrode and the second electrode; a first controller controlling a voltage applied to the first wiring lines; a second controller controlling a voltage applied to the second wiring lines; and a selection circuit selecting M second wiring lines from the K second wiring lines.

19 Claims, 14 Drawing Sheets

(51) Int. Cl.
    *H01L 27/24*       (2006.01)
    *H01L 45/00*       (2006.01)
(52) U.S. Cl.
    CPC ...... *H01L 27/2436* (2013.01); *H01L 27/2463* (2013.01); *H01L 45/04* (2013.01); *H01L 45/085* (2013.01); *H01L 45/1233* (2013.01); *H01L 45/1253* (2013.01); *H01L 45/145* (2013.01); *H01L 45/146* (2013.01)
(58) Field of Classification Search
    CPC ............ G11C 13/0028; G11C 13/0069; G11C 13/0004; G11C 13/0007; G11C 13/0038; G11C 13/004; G11C 2213/72; G11C 5/143
    USPC ...... 365/148, 163, 230.06, 51, 63, 154, 156, 365/189.04, 189.08, 189.09, 189.11, 365/189.14, 189.16
    See application file for complete search history.

(56) References Cited

U.S. PATENT DOCUMENTS

| | | | |
|---|---|---|---|
| 2007/0257704 | A1 | 11/2007 | Mouttet |
| 2015/0243887 | A1* | 8/2015 | Saitoh ................. H01L 45/1253 257/4 |

FOREIGN PATENT DOCUMENTS

| | | |
|---|---|---|
| JP | 2012-234885 | 11/2012 |
| JP | 2015-18590 | 1/2015 |
| WO | WO 2015/005149 | 1/2015 |

* cited by examiner

SEMICONDUCTOR INTEGRATED CIRCUIT

CROSS REFERENCE TO RELATED APPLICATIONS

This application is based upon and claims the benefit of priority from prior Japanese Patent Application No. 2015-003603 filed on Jan. 9, 2015 in Japan, the entire contents of which are incorporated herein by reference.

FIELD

Embodiments described herein relate generally to semiconductor integrated circuits.

BACKGROUND

Programmable logic devices are semiconductor integrated circuits that can be rewritten after the chips are manufactured. A programmable logic device includes a plurality of wiring lines, of which selected two wiring lines are electrically connected or disconnected. Some methods are known to control the connection state.

One of the methods for controlling the connection of wiring lines uses transistors and memory elements. The memory elements are electrically programmable. The transistors are turned on or off based on data programmed in the memory elements. SRAMs are typically used as the memory elements.

Another method is also known, in which a resistive change memory is disposed between two or more wiring lines. Nonvolatile resistive change elements with two terminals are known as the resistive change memories. A low-resistance state and a high-resistance state of a nonvolatile resistive change memory may be switched by applying a predetermined voltage between the two terminals.

Circuits including many memory elements are generally likely to have defective elements. Therefore, redundant bits for replacing defective bits are prepared in advance to perform a correct circuit operation even if some memory elements are defective. However, a technique of replacing defective bits with redundant bits in a programmable logic device including resistive change memory elements has not yet been known.

DETAILED DESCRIPTION

A semiconductor integrated circuit according to an embodiment includes: N ($\geq 1$) input wiring lines; M ($\geq 1$) output wiring lines; N first wiring lines corresponding to the N input wiring lines, each of the first wiring lines connecting to a corresponding input wiring line; K ($>M$) second wiring lines crossing the N first wiring lines; a plurality of first resistive change elements disposed at intersections of the first wiring lines and the second wiring lines, each of the first resistive change elements including a first electrode connecting to a corresponding one of the first wiring lines, a second electrode connecting to a corresponding one of the second wiring lines, and a first resistive change layer disposed between the first electrode and the second electrode; a first controller configured to control a voltage applied to the first wiring lines; a second controller configured to control a voltage applied to the second wiring lines; and a selection circuit disposed between the output wiring lines and the second wiring lines to select M second wiring lines from the K second wiring lines, and to connect the selected M second wiring lines to the output wiring lines.

Embodiments will now be explained with reference to the accompanying drawings.

Figure 1:
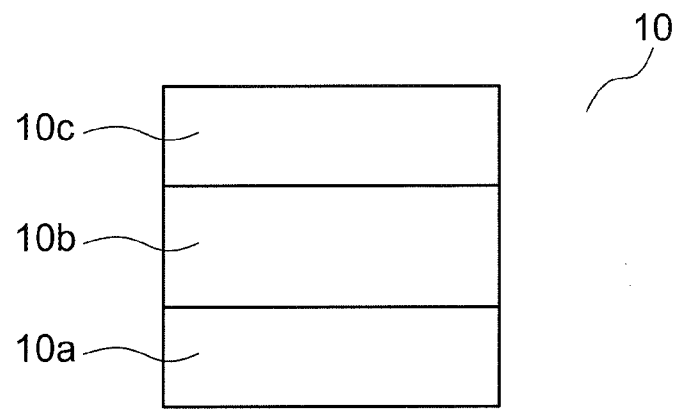
FIG. 1 is a cross-sectional view showing an example of a resistive change memory element.

FIG. 1 shows an example of a resistive change memory element (hereinafter also referred to as "memory element"). The memory element 10 includes electrodes 10a, 10c, and a resistive change layer 10b sandwiched between the electrodes 10a, 10c. The resistive change layer 10b may be formed of a metal oxide such as titanium oxide, hafnium oxide, tantalum oxide, aluminum oxide, and silicon oxide, or a semiconductor oxide, or a semiconductor material like amorphous silicon. A film including layers of the aforementioned materials may also be used.

The resistance between the electrodes 10a, 10c in the memory 10 may be switched by applying a predetermined voltage therebetween. The term "set" herein means that the resistive state of the memory element is switched from a high-resistance state to a low-resistance state, and the term "reset" herein means that the resistive state is switched from a low-resistance state to a high-resistance state. A voltage needed for setting the memory element is herein called "set voltage," and a voltage needed for resetting the memory element is herein called "reset voltage."

Figure 2:
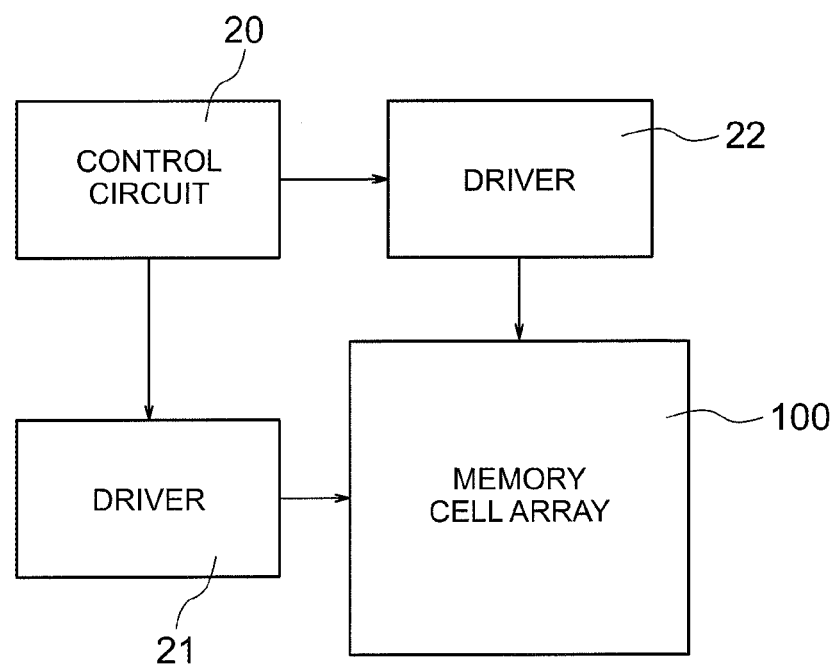
FIG. 2 is a block diagram showing an example of a nonvolatile memory in which resistive change memory elements are arranged in an array form.

FIG. 2 is a block diagram showing an example of a nonvolatile memory device in which resistive change memory elements are arranged in an array form. In order to apply the set voltage or reset voltage to a predetermined memory element, the nonvolatile memory device shown in FIG. 2 may be used. The memory cell array 100 includes a plurality of memory elements arranged in an array form, and is connected to a driver 21 and a driver 22. The drivers 21, 22 receive control signals from a control circuit 20, and apply a program voltage to a selected memory element based on the control signals. Similarly, the drivers 21, 22 may apply a predetermined voltage to non-selected memory elements based on the control signals, or may bring the potential of the electrode of a specific memory element into a floating state based on the control signals.

Figure 3:
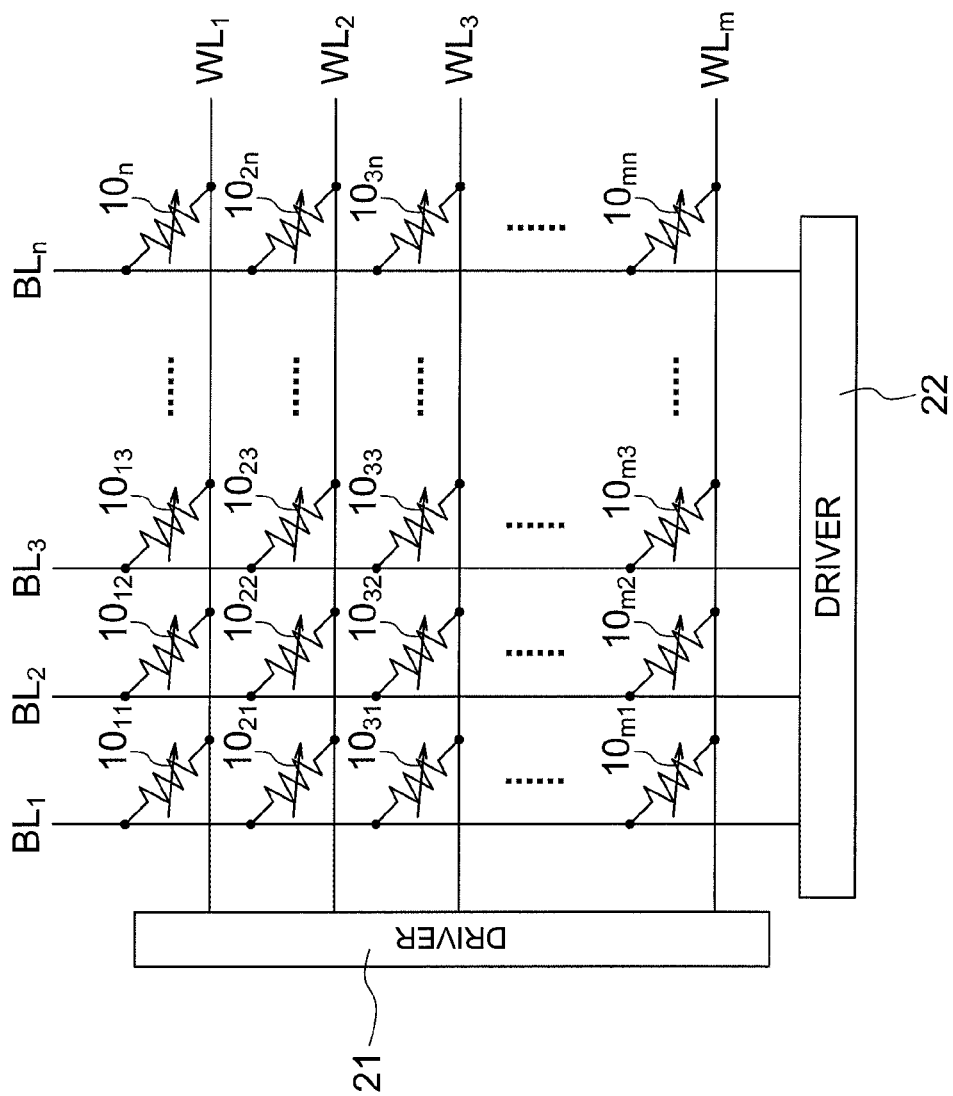
FIG. 3 is a circuit diagram showing a specific configuration of a memory cell array and drivers for driving the memory cell array.

FIG. 3 shows an example of a specific circuit configuration of the memory cell array 100, the driver 21, and the driver 22. This circuit includes m word lines $WL_i$ ($1 \leq i \leq m$), n bit lines $BL_j$ ($1 \leq j \leq n$), and memory elements $10_{ij}$ disposed on intersections of these wiring lines. When a memory element, for example the memory element $10_{23}$, is to be programmed, the driver 21 applies a predetermined voltage to the word line $WL_2$ connected to the memory element $10_{23}$, and the driver 22 applies a predetermined voltage to the bit line $BL_3$ connected to the memory element $10_{23}$.

Figure 4:
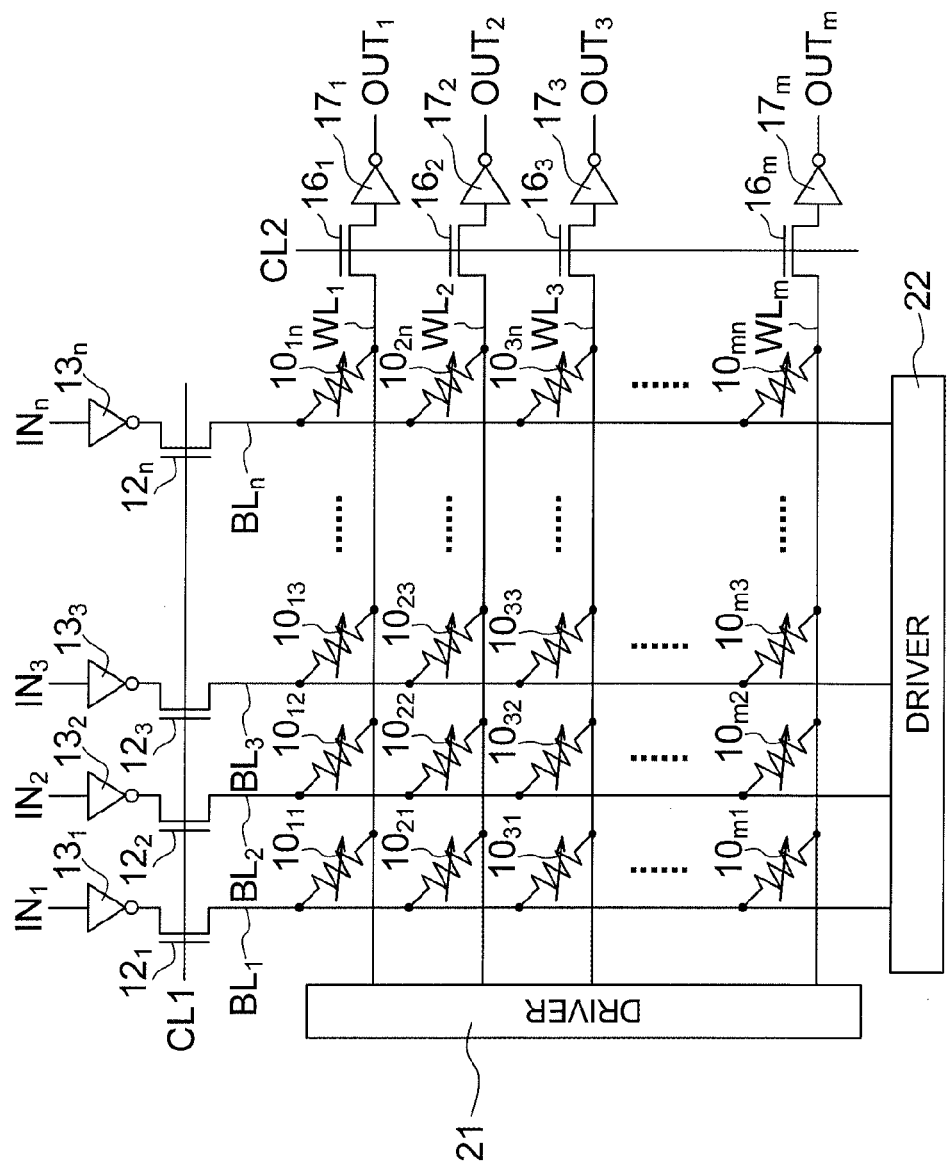
FIG. 4 is a diagram showing a specific example of a reconfigurable circuit in which the circuit shown in FIG. 3 is applied to a programmable logic device.

FIG. 4 shows a specific example of a reconfigurable circuit to which the circuit shown in FIG. 3 is applied as a programmable logic device. In this example, the bit lines $BL_j$ ($1 \leq j \leq n$) are connected to the output terminals of buffers $13_j$ such as inverters via transistors $12_j$. The input terminal of the buffers $13_j$ are connected to input lines $IN_j$. Similarly, the word lines $WL_i$ ($1 \leq i \leq m$) are connected to input terminals of buffers $17_i$ such as inverters via transistors $16_i$, and the output terminals of the buffer $17_i$ are connected to output lines $OUT_i$. A signal inputted to one of the input lines $IN_j$ ($1 \leq j \leq n$) is transmitted to at least one of the output lines $OUT_i$ via a memory element that is in a low-resistance state. The transistors $12_j$ between the bit lines $BL_j$ ($1 \leq j \leq n$) and the buffers $13_j$, and/or the transistors $16_i$ between the word lines $WL_i$ ($1 \leq i \leq m$) and the buffers $17_i$ may be omitted. However, the presence of these transistors may prevent damage to the peripheral circuits such as the buffers caused by the set voltage or reset voltage when a memory element is programmed.

When a set voltage or a reset voltage is applied to the memory element, a circuit for limiting the current flowing through the memory element to be equal to or less than a predetermined value ("limited current value") may be provided to suppress variations in resistance of the memory element or to prevent irreversible breakdown of the memory element. Generally, if the limited current value in a set operation increases, the resistance of the memory element after the set operation decreases. In a reset operation, the limited current value should be sufficiently large to cause a sufficient amount of current to flow through the memory element in order to generate heat that changes the resistive state of the memory element to a high-resistance state. As described above, different limited current values are used in the set operation and the reset operation.

Figure 5A:
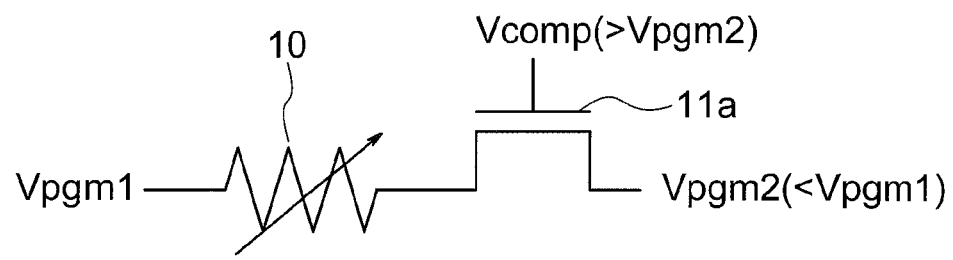
FIG. 5A is a diagram showing an example of a current limitation circuit.
Figure 5B:
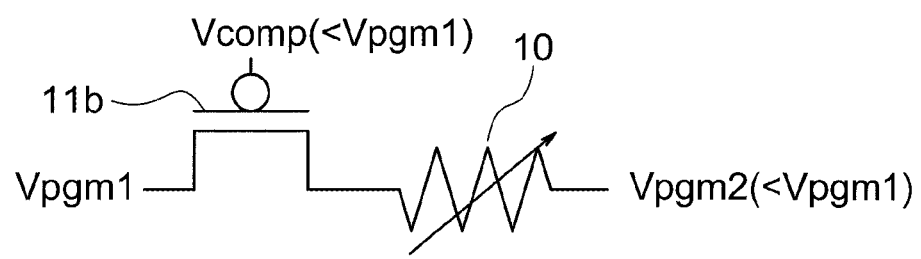
FIG. 5B is a diagram showing an example of a current limitation circuit.

FIGS. 5A and 5B show examples of a current limitation circuit for generating a limited current value. The maximum current flowing through the memory element 10 is controlled by controlling a voltage Vcomp applied to the gate of the transistor 11 connected in series with the memory element 10. In the example shown in FIG. 5A, a voltage Vpgm1 is applied to one of the electrodes of the memory element 10, and a voltage Vpgm2 that is lower than the voltage Vpgm1 is applied to the other of the electrodes via an n-channel transistor 11a. A voltage Vcomp that is higher than the voltage Vpgm2 is applied to the gate of the transistor 11a at this time. The maximum current flowing through the memory element 10 during a program operation is controlled by controlling the magnitude of the voltage Vcomp. Although the n-channel transistor 11a is used as an element for limiting the current, a p-channel transistor 11b may also be used as shown in FIG. 5B. In this case, a voltage Vpgm2 is applied to one of the electrodes of the memory element 10, and a voltage Vpgm1 that is higher than the voltage Vpgm2 is applied to the other of the electrodes via the p-channel transistor 11b. A voltage Vcomp that is lower than the voltage Vpgm1 is applied to the gate of the transistor 11b at this time. The maximum current flowing through the memory element 10 during program operation is controlled by the magnitude of the voltage Vcomp.

Figure 6A:
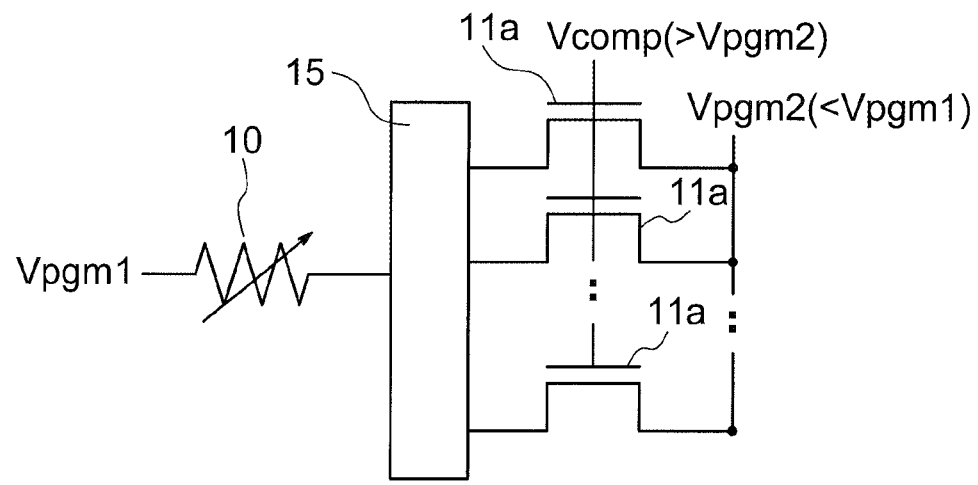
FIG. 6A is a diagram showing an example of a current limitation circuit.
Figure 6B:
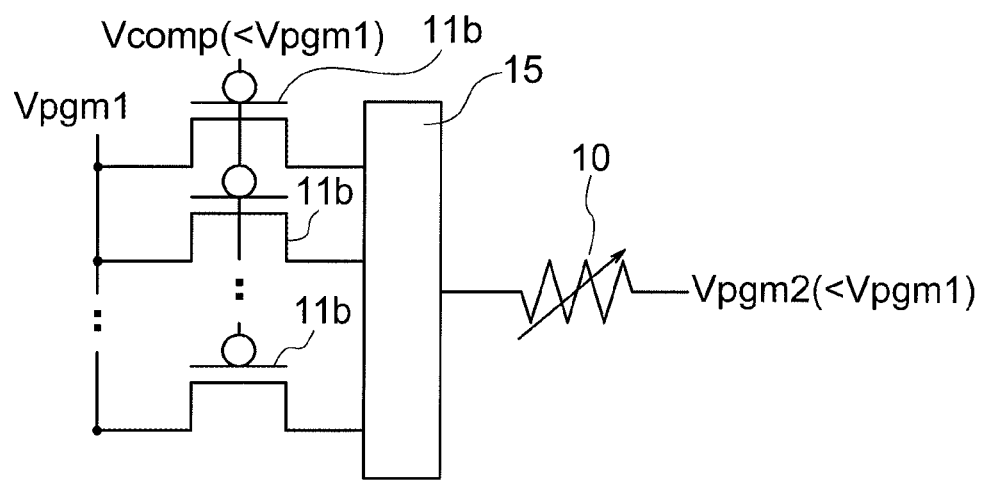
FIG. 6B is a diagram showing an example of a current limitation circuit.

A plurality of limited current values may be set in the examples shown in FIGS. 5A and 5B by changing the value of the Vcomp. FIGS. 6A and 6B show other examples, in which a combination of a plurality of n-channel transistors 11a and a selector 15, and a combination of a plurality of p-channel transistors 11b and a selector 15 are prepared, respectively. In these cases, the transistors 11a or 11b are designed in such a manner that the driving capability differs among them, and the amount of current obtained from the same amount of voltage differs among them. Specifically, the transistors are formed so that the channel width, the gate length, and/or the thickness of the gate insulating film or the channel impurity concentration of the respective transistors may differ. In programming a memory element, the memory element and one of the transistors is connected in accordance with the required value of the limited current.

The limited current value is generally set to be low if the memory element is set, to control the maximum value of the current flowing through the memory element to be low. The resistance of the memory element after the set operation is dependent on the limited current value. As the limited current value decreases, the resistance of the memory element after the set operation increases. If the memory element is to be reset, the limited current value is increased to cause a sufficient amount of current to flow through the memory element to generate heat needed for resetting the memory element.

The setting of the memory element by means of the above-described current limitation circuit may be applied to the programmable logic device shown in FIG. 4. Although the circuit shown in FIG. 4 includes the two drivers 21, 22, the limited current value in a set operation is preferably set by the driver 21. The following is the reason for this.

It is assumed that a set voltage is applied to the memory element $10_{21}$, for example, of the reconfigurable circuit shown in FIG. 4. At this time, a potential difference is given to the electrodes of the memory element $10_{21}$ by the drivers 21, 22. It is assumed in this case that the driver 21 applies a set voltage Vset to the word line $WL_2$, and the driver 22 applies a ground voltage Vss to the bit line $BL_1$. It should be noted that the driver 21 may apply the ground voltage Vss to the word line $WL_2$, and the driver 22 may apply the set voltage Vset to the bit line $BL_1$. At the same time, the driver 21 applies a program inhibit voltage Vinh to the word lines other than the word line $WL_2$ and the driver 22 applies the program inhibit voltage Vinh to the bit lines other than the bit line $BL_1$ so that no data is accidentally written to any of the memory elements other than the memory element $10_{21}$.

The program inhibit voltage Vinh is, for example, an intermediate voltage between the set voltage Vset and the ground voltage Vss.

It is assumed here that the memory element $10_{11}$ is already in the low-resistance state. At this time, the program inhibit voltage Vinh is applied to the word line $WL_1$ by the driver 21, and the ground voltage Vss is applied to the bit line $BL_1$ by the driver 22.

If a limited current value is set by the driver 22, the ground voltage Vss is applied to the bit line $BL_1$ via a transistor for current limitation as shown in FIGS. 5A to 6B. On the other hand, the program inhibit voltage Vinh, which is applied to the word line $WL_1$ by the driver 21, is also applied to the bit line $BL_1$ via the memory element $10_{11}$ that is in the low-resistance state. Whether the potential of the bit line $BL_1$, is at Vss or Vinh is determined by the ratio between the resistance of the transistor for current limitation and the resistance of the memory element $10_{11}$. The potential of the bit line $BL_1$, however, may become close to Vinh since the transistor for current limitation has a relatively high resistance. If the potential of the bit line $BL_1$ is at the program inhibit voltage Vinh, the voltage applied to the memory element $10_{21}$ also becomes the program inhibit voltage Vinh. As a result, the memory element $10_{21}$ cannot be set.

If the limited current value is set by the driver 21, the program inhibit voltage Vinh is applied to the word line $WL_1$ via the transistor for current limitation. On the other hand, the ground voltage Vss is applied to the bit line $BL_1$ by the driver 21 without the transistor for current limitation. This causes the potential of the bit line $BL_1$ to be at the ground voltage Vss. As a result, the memory element $10_{21}$ can be reliably set.

In the above example, the memory element $10_{11}$ is in the low-resistance state when the memory element $10_{21}$ is set. If, in a similar example, the memory element $10_{22}$ is in the low-resistance state when the memory element $10_{21}$ is set, it is preferable that the driver 22 set the limited current value. However, two or more memory elements connected to a wiring line in one output direction are never brought into the low-resistance state at the same time in a programmable logic device. The "wiring line in one output direction" here means the wiring line connecting a memory element and an input terminal of a buffer, and corresponds to a word line in FIG. 4, for example. A plurality of memory elements connected the same word line, for example the memory element $10_{21}$ and the memory element $10_{22}$, being in the low-resistance state at the same time means that both the input line $IN_1$ and the input line $IN_2$ may be connected to the output line $OUT_2$. This makes it unclear from which input lines a signal outputted from the output line $OUT_2$ comes.

Therefore, if the memory elements are applied to a programmable logic device, it is appropriate that a limited current value is set by a driver (driver 21 in this case) connected to a wiring line in an output direction (word line).

Circuits including memories are often designed so that the chips may be used without any problem even if some memory elements are defective bits. An example of the design is a technique using redundancy bits. This technique prepares spare memory elements in addition to the required number of memory elements, and replaces defective memory elements with the spare memory elements. The redundancy technique may suppress an increase in costs caused by defective memory elements since the presence of defective bits does not lead to discarding of the entire chips.

The following embodiments include reconfigurable circuits using this redundancy technique.

First Embodiment

Figure 7:
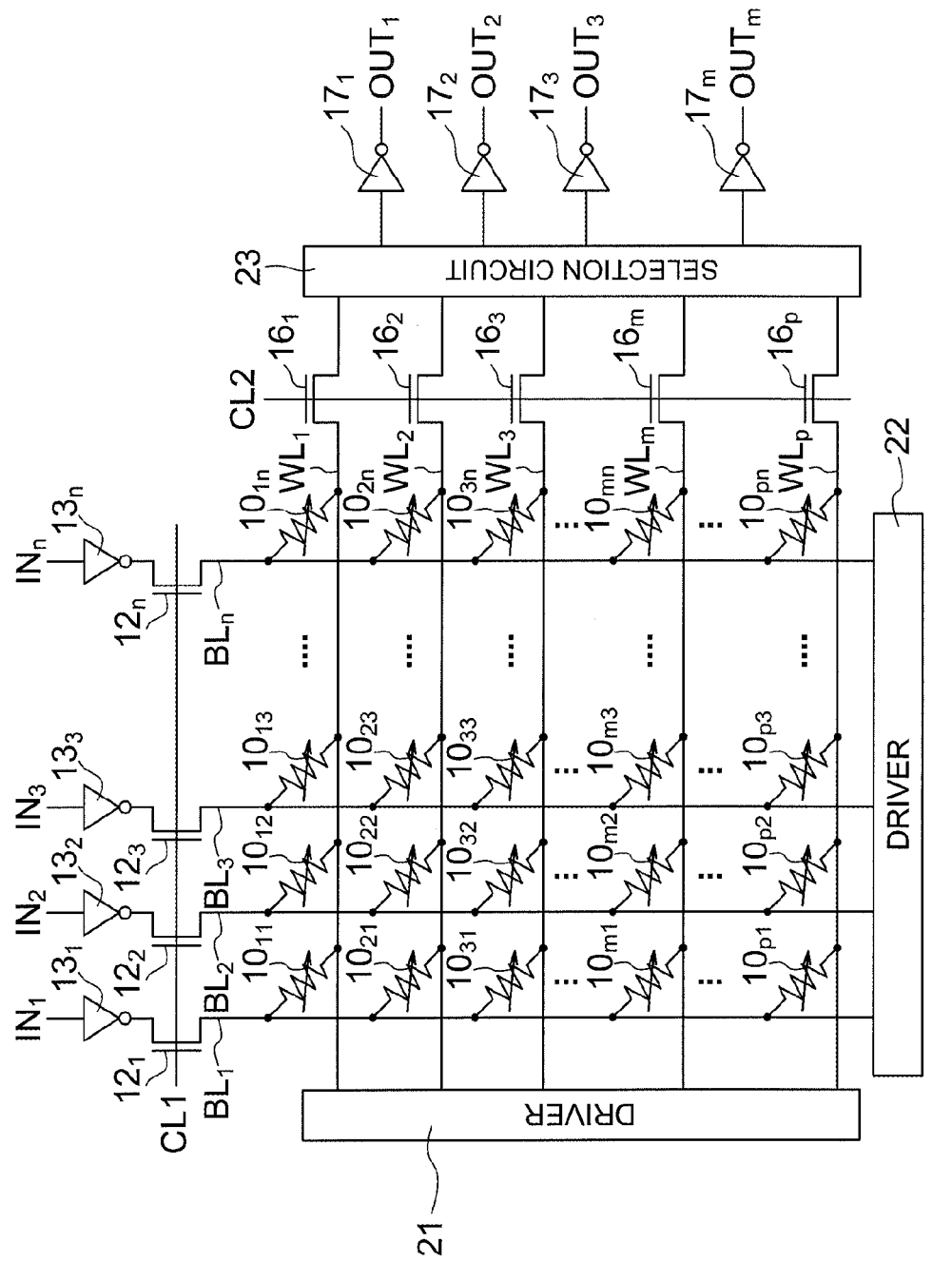
FIG. 7 is a circuit diagram showing a reconfigurable circuit according to a first embodiment.

FIG. 7 shows a semiconductor integrated circuit according to a first embodiment. This semiconductor integrated circuit comprises a reconfigurable circuit. This reconfigurable circuit represents a case where the reconfigurable circuit shown in FIG. 4 employs the redundancy technique. The circuit according to the first embodiment includes p word lines $WL_i$ ($1 \leq i \leq p$, where m<p), n bit lines $BL_j$ ($1 \leq j \leq n$), and memory elements $10_{ij}$ disposed at intersections of these wiring lines. The word lines $WL_i$ ($1 \leq i \leq p$) are connected to a selection circuit 23 via transistors $16_i$. The selection circuit 23 selects m word lines from the p word lines $WL_1$-$WL_p$. The selected m word lines are connected to input terminals of buffers $17_1$-$17_m$ such as inverters. Output terminals of the buffers $17_1$-$17_m$ are connected to output lines $OUT_1$-$OUT_m$.

The bit lines $BL_j$ ($1 \leq j \leq n$) are connected to output terminals of buffers $13_j$ such as inverters via transistors $12_j$. Input terminals of the buffers $13_j$ are connected to input lines $IN_j$. The transistors $12_j$ between the bit lines $BL_j$ ($1 \leq j \leq n$) and the buffers $13_j$, and the transistors $16_i$ between the word lines $WL_i$ ($1 \leq i \leq p$) and the selection circuit 23 may be omitted. However, the presence of these transistors may prevent damage to peripheral circuits such as the buffers $13_1$-$13_n$ and the selection circuit 23 caused by the set voltage or the reset voltage when a memory element is programmed. The driver 21 is connected to the word lines $WL_i$ ($1 \leq i \leq p$) to apply predetermined voltages to the word lines when a memory element is programmed. The driver 22 is connected to the bit lines $BL_j$ ($1 \leq j \leq n$) to apply predetermined voltages to the bit lines when a memory element is programmed.

Although the reconfigurable circuit shown in FIG. 7 includes n input lines IN and m output lines OUT, the number of memory elements is (n×p), including spare memory elements. If the memory elements include a defective bit, the selection circuit 23 controls the connection of the wiring lines so that other word lines than the one connecting to the defective bit are connected to the output lines. For example, if there is no defective bit in the memory elements of the circuit shown in FIG. 7, the selection circuit 23 may select the word lines $WL_1, \ldots, WL_m$.

If the memory element $10_{23}$ is a defective bit, the selection circuit 23 may select the word lines $WL_1, WL_3, \ldots, WL_m$, $WL_{m+1}$. This enables the circuit to operate without using the memory element $10_{23}$ but using only normal memory elements.

In FIG. 7, the number of word lines is greater than the number of output lines, and the selection circuit 23 is connected to the word lines. However, the number of bit lines is the same as the number of input lines. It is not preferable that the number of bit lines be greater than the number of input lines, and the selection circuit 23 be made to connect to the bit lines. The following is the reason for this.

It is assumed that the memory element $10_{21}$ is set by the method described with reference to FIG. 4. The driver 21 applies a set voltage Vset (or 0 V) to the word line $WL_2$ via the transistor for current limitation, and a program inhibit voltage Vinh to the other word lines via the transistors for current limitation. The driver 22 applies 0V (or Vset) to the bit line $BL_1$, and the program inhibit voltage Vinh to the other bit lines.

As described above, if there is a memory element in the low-resistance state in the memory element $10_{22}, \ldots, 10_{2n}$ connected to the same word line as the memory element $10_{21}$, the program inhibit voltage Vinh is applied to the word line $WL_2$ via the low-resistance-state memory element. This makes the voltage of the word line $WL_2$ unstable. As a result, the memory element $10_{21}$ cannot be normally set.

A resistive change memory element may be defective if the electrode $10a$ and the electrode $10c$ are short-circuited. This means that the defective memory element is in the low-resistance state that is irreversible. Therefore, the defective memory element cannot be programmed to be in the high-resistance state. Therefore, if there is a defective memory element, the other memory elements connecting to the same word line together with the defective memory element cannot be set. On the other hand, the other memory elements connecting to the same bit line as the defective memory element may be set.

If, for example, the memory element $10_{23}$ is a defective bit in the reconfigurable circuit shown in FIG. 7, the other memory elements $10_{21}$, $10_{22}$, $10_{24}$, ..., $10_{2n}$ connected to the word line $WL_2$ cannot be normally set. When the reconfigurable circuit operates, the selection circuit 23 does not select the word line $WL_2$, but connects any word lines other than the word line $WL_2$ to the buffers. Therefore, the memory elements connected to the same word lines as the defective memory element are not used for the circuit operation, and thus not needed to be programmed.

If the selection circuit 23 is disposed to connect to the bit lines, the memory elements connected to the same bit line as the defective memory element are not used for the circuit operation. For example, if the memory element $10_{23}$ is a defective bit, the memory elements $10_{13}$, $10_{33}$, ..., $10_{m3}$ connected to the bit line $BL_3$ are not used for the circuit operation. On the other hand, if the memory element $10_{23}$ is a defective bit, the memory elements connected to the same word line as the defective memory element $10_{23}$, i.e., the memory elements $10_{21}$, $10_{22}$, ..., $10_{2n}$ are used for the circuit operation. However, these memory elements cannot be normally set by the aforementioned programming method. As a result, the circuit cannot be rewritten.

In short, when resistive change memory elements are applied to a programmable logic device, a limited current value in a program operation is preferably set by a driver (driver 21) connected to a wiring line (word line) in the output direction. Furthermore, it is preferable that the number of wiring lines (word lines) in the output direction be greater than the number of output lines, and the selection circuit 23 be connected to the wiring lines in the output direction, as in the circuit shown in FIG. 7.

As described above, according to the first embodiment, a reconfigurable circuit capable of reducing the defective fraction of the chip may be provided.

Second Embodiment

Figure 8:
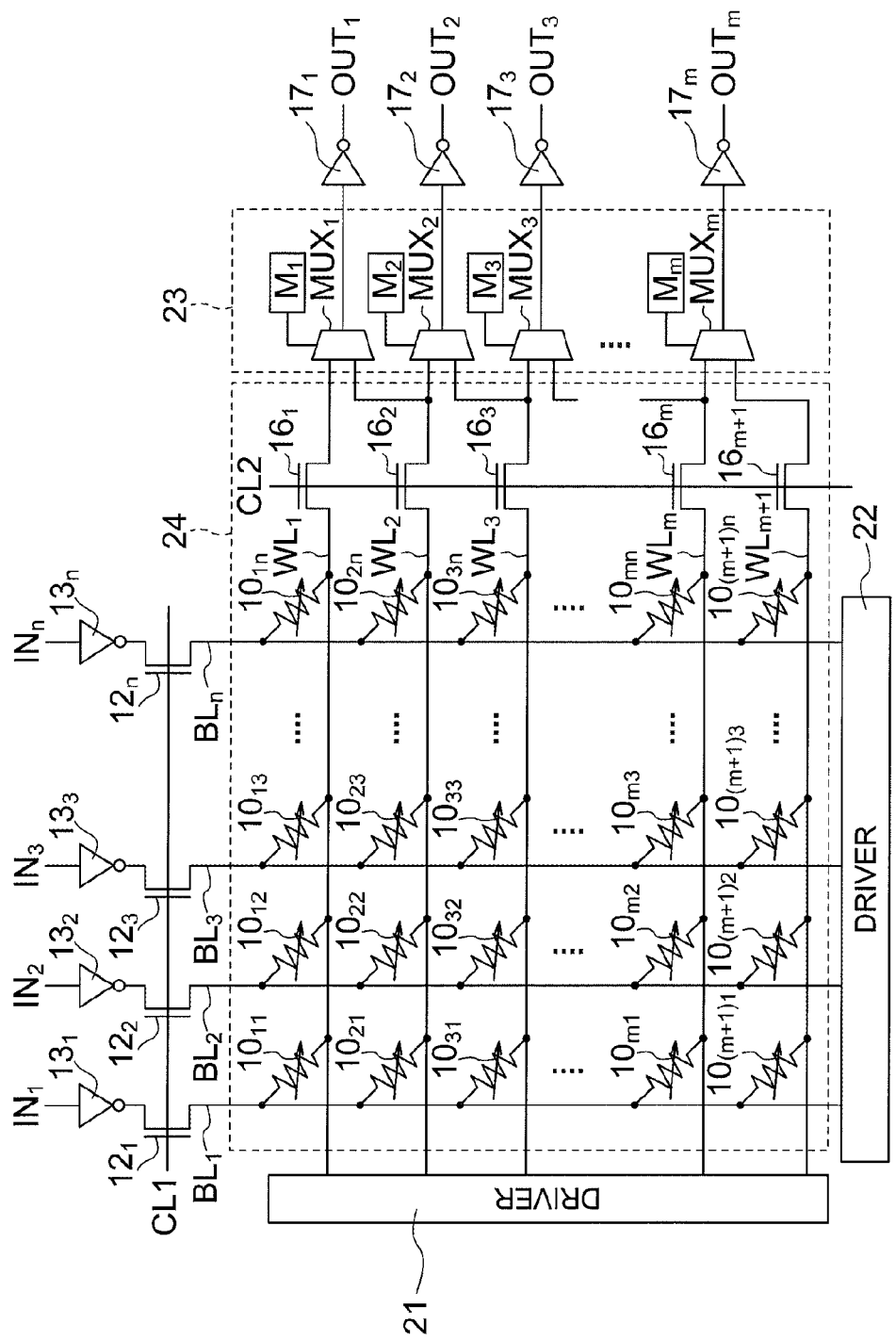
FIG. 8 is a circuit diagram showing a reconfigurable circuit according to a second embodiment.

FIG. 8 shows a reconfigurable circuit according to a second embodiment. The reconfigurable circuit according to the second embodiment includes m+1 word lines $WL_1$-$WL_{m+1}$ for m output lines $OUT_1$-$OUT_m$ in the reconfigurable circuit according to the first embodiment shown in FIG. 7. A selection circuit 23 selects m word lines from the m+1 word lines $WL_1$-$WL_{m+1}$, and connects the selected word lines to buffers $17_1$-$17_m$.

The selection circuit 23 includes m multiplexers $MUX_1$-$MUX_m$ each having two input terminals and one output terminals. The input terminals of a multiplexer $MUX_i$ ($1 \le i \le m$) are connected to the word line $WL_i$ and the word line $WL_{i+1}$, and the output terminal is connected to the output line $OUT_i$ via the buffer $17_i$, and the selection terminal of the multiplexer $MUX_i$ ($1 \le i \le m$) is connected to a selection memory $M_i$. The multiplexer $MUX_i$ ($1 \le i \le m$) selects one of the word line $WL_i$ and the word line $WL_{i+1}$ based on the information from the selection memory $M_i$, and outputs the potential of the selected one of the word lines.

It is assumed that the memory elements connected to the word line $WL_k$ ($1 \le k \le m$) includes a defective bit. On this occasion, the selection memories $M_1$, ..., $M_{k-1}$ store data "0" and each of the multiplexers $MUX_i$ ($1 \le i \le k-1$) selects the word line $WL_i$, and the selection memories $M_k$, ..., $M_m$ store data "1" and the multiplexer $MUX_i$($k \le i \le m$) selects the word line $WL_{i+1}$.

If no defective bit is present in the memory elements connected to the word lines $WL_1$, ..., $WL_m$, the selection memories $M_1$, ..., $M_m$ store data "0" and the multiplexer $MUX_i$ ($1 \le i \le m$) selects the word line $WL_i$. As a result, only the word lines not connecting to the defective bit can be used for the circuit operation.

For example, if the memory element $10_{23}$ is a defective, the selection memory $M_1$ stores data "0" and the multiplexer $MUX_1$ selects the word line $WL_1$. The selection memory $M_i$ ($2 \le i \le m$) stores data "1" and the multiplexer $MUX_i$ ($2 \le i \le m$) selects the word line $WL_{i+1}$. As a result, the word lines other than the word line $WL_2$ can be used for the circuit operation.

(First Modification)

Figure 9:
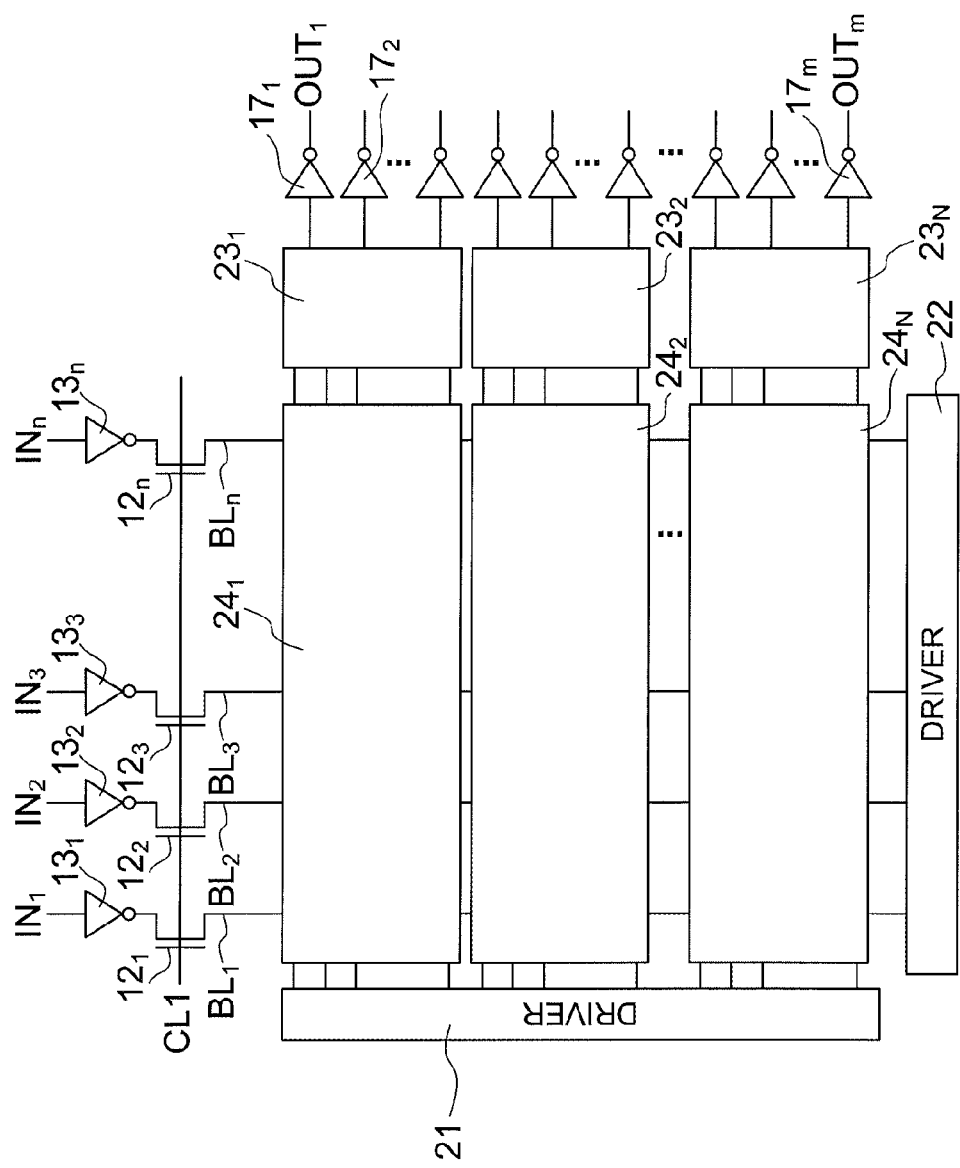
FIG. 9 is a circuit diagram showing a reconfigurable circuit according to a first modification of the second embodiment.

In the second embodiment shown in FIG. 8, the number of word lines is greater than the number of output lines by one. However, depending on the defective fraction of the memory elements, it may be preferable that the number of word lines be greater than the number of output lines by two or more. In order to deal with this demand, a desired number of circuits shown in FIG. 8 may be arranged to form a reconfigurable circuit, as in a first modification of the second embodiment shown in FIG. 9. In the first modification shown in FIG. 9, a memory array is divided into N regions $24_1$-$24_N$. In each region, the selection circuit $23_i$ ($1 \le i \le N$) selects word lines other than one, the number of whole word lines being greater than the number of output lines by one.

In conventional redundancy techniques, the memories in the selection circuit are formed by flip-flops. Data stored in a flip-flop is erased when the power is turned off. Accordingly, when the power is turned on again, the data should be reloaded from a separate nonvolatile memory to the flip-flop. A fuse element may be used as the nonvolatile memory.

Preparing the nonvolatile memory separately for data that should be reloaded when the power is turned off leads to high costs. Furthermore, flip-flops require large circuit areas, which leads to an increase in chip area.

(Second Modification)

Figure 10:
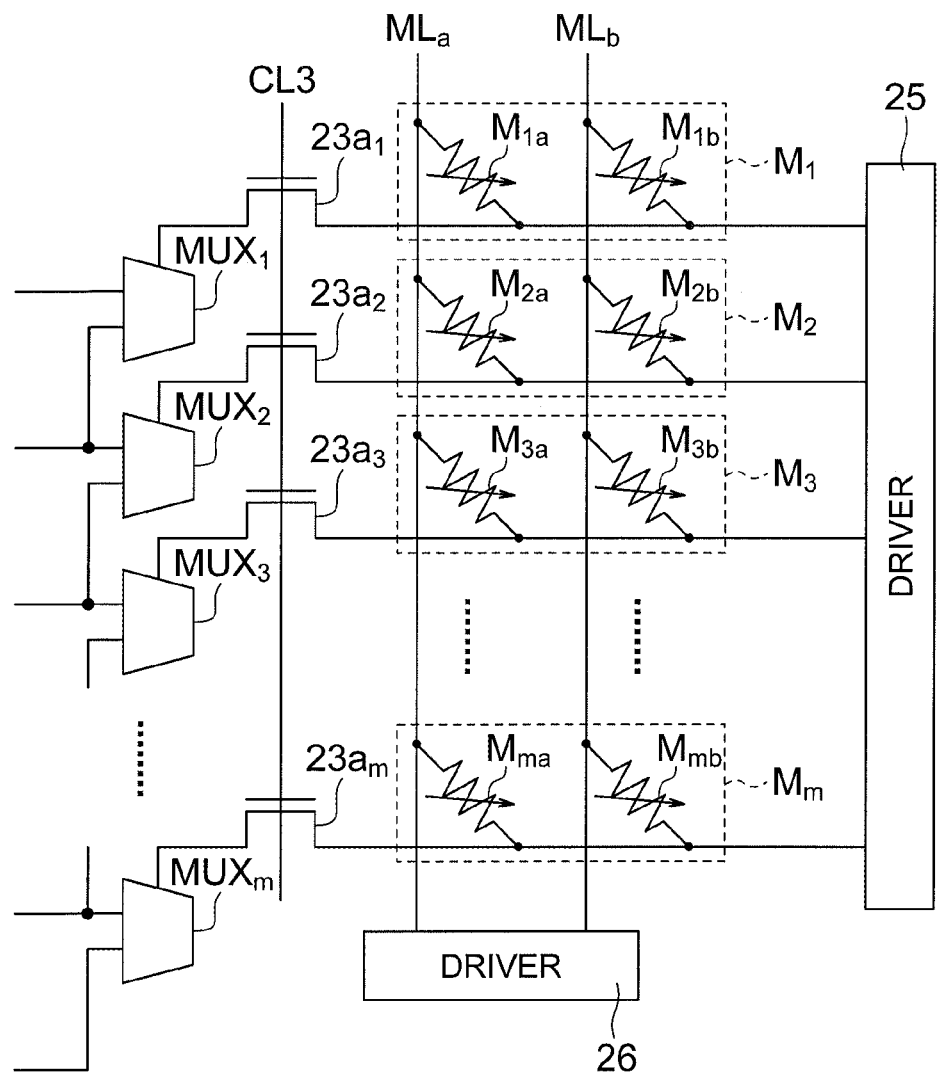
FIG. 10 is a circuit diagram showing an example of a selection circuit included in a reconfigurable circuit according to a second modification of the second embodiment.

A reconfigurable circuit according to a second modification of the second embodiment will be described with reference to FIG. 10. The reconfigurable circuit according to the second modification includes two resistive change memory elements $M_{ia}$, $M_{ib}$ that constitutes a selection memory $M_i$ ($1 \le i \le m$) of the selection circuit 23 in the second embodiment shown in FIG. 8. FIG. 10 shows the selection circuit 23 of the second modification. One of the two resistive change memory elements $M_{ia}$, $M_{ib}$, the memory element $M_{ia}$, is connected to a wiring line $ML_a$, and the other, the memory element $M_{ib}$, is connected to a wiring line $ML_b$ in the selection memory $M_i$ ($1 \le i \le m$).

One of the resistive change memory elements $M_{ia}$, $M_{ib}$ is programmed to be in a low-resistance state, and the other is programmed to be in a high-resistance state in each selection memory $M_i$ ($1 \le i \le m$) by drivers 25, 26. When the circuit operates, a power supply voltage is applied to the wiring line $ML_a$, and a ground voltage is applied to the wiring line $ML_b$. For example, if the memory element $M_{1a}$ connecting to the wiring line $ML_a$ is in the low-resistance state and the memory element $M_{1b}$ connecting to the wiring line $ML_b$ is in the high-resistance state in the selection memory $M_1$, the power supply voltage is applied to the selection terminal of the multiplexer $MUX_1$ via a transistor $23a_1$. On the contrary, if the memory element $M_{1a}$ connecting to the wiring line $ML_a$ is in the high-resistance state and the memory element $M_{1b}$ connecting to the wiring line $ML_b$ is in the low-resistance state, the ground voltage is applied to the selection terminal of the multiplexer $MUX_1$ via the transistor $23a_1$. The multiplexer $MUX_i$ ($1 \le i \le m$) selects one of two input terminals based on the signal inputted to the selection terminal. When the circuit operates, the transistors $23a_1$-$23a_m$ are in the ON state.

The transistor $23a_i$ is disposed between the selection memory $M_i$ ($1 \le i \le m$) and the multiplexer $MUX_i$ in the selection circuit 23 shown in FIG. 10. The transistor $23a_i$ ($1 \le i \le m$) prevents the multiplexer $MUX_i$ from being broken, or degraded in performance due to a high voltage directly applied to the selection terminal of the multiplexer $MUX_i$ when the selection memory $M_i$ is programmed. If the voltage required to program the selection memory $M_i$ ($1 \le i \le m$) is satisfactorily low, or the breakdown voltage of the multiplexer $MUX_i$ is sufficiently high, the transistor $23a_i$ may be omitted.

The selection memories $M_1$-$M_m$ are required to be highly reliable as compared to the memory elements 10 of the memory cell array (FIG. 1). If the aforementioned redundancy technique is used, any defectiveness in the memory elements may not affect the circuit operation. However, any defectiveness in the selection memories $M_1$-$M_m$ may cause the selection circuit 23 to select a wrong word line. This may lead to a malfunction of the circuit.

How to make the selection memories $M_1$-$M_m$ highly reliable when the selection memories $M_1$-$M_m$ have the same structure as the memory elements as shown in FIG. 10 will be described below.

A first method employs a higher voltage in programming the selection memories $M_1$-$M_m$ than the voltage used for programming the memory elements 10 of the memory array.

A second method employs a longer period of time for applying a voltage in programming the selection memories $M_1$-$M_m$ than the period of time in programming the memory elements 10.

A third method employs a higher limited current value in programming the selection memories $M_1$-$M_m$ than the limited current value in programming the memory elements 10.

The third method is especially effective in setting the selection memories $M_1$-$M_m$. The reliability of the selection memories $M_1$-$M_m$ may be improved by any of the first to third methods, or any combination of these methods performed simultaneously.

It is preferable that the limited current in a program operation according to the third method be set by the driver 25.

If the selection memories $M_1$-$M_m$ are formed as one-time programmable memory elements, the reliability may further be improved. A one-time programmable memory element can be written only once, and cannot be rewritten after it is once written. Anti-fuse memory elements are known as one-time programmable memory elements. An anti-fuse memory element includes, for example, two electrodes and an insulating material disposed between the two electrodes. Anti-fuse memory elements are in a high-resistance state immediately after the manufacture. The resistive state may be changed to a low-resistance state by applying a predetermined voltage or causing a predetermined current to flow between the electrodes to cause an irreversible electrical breakdown in the insulating material. Since the electrical breakdown is irreversible, the anti-fuse memory element once brought into the low-resistance state cannot be brought into the high-resistance state again.

Since the resistive change film 10b of the memory element 10 is formed of an insulating material immediately after the manufacture, the selection memories $M_1$-$M_m$ having the same structure as the memory element 10 can be used as anti-fuse memory elements. In other words, the resistive state of the memory elements of the selection memories $M_1$-$M_m$ can be irreversibly changed to a low-resistance state.

The memory elements $M_{ia}$, $M_{ib}$ ($i=1, \ldots, m$) constituting the selection memories $M_1$-$M_m$ may be irreversibly brought into the low-resistance state by the same methods as the methods for making the selection memories $M_1$-$M_m$ highly reliable. Specifically, the voltage for programming the selection memories $M_1$-$M_m$ may be made higher than the voltage for setting the memory element 10, or the period of time for applying the voltage in programming the selection memories $M_1$-$M_m$ may be made higher than the period of time for applying the voltage for setting the memory element 10, or the limited current for programming the selection memories $M_1$-$M_m$ may be made higher than the limited current for setting the memory element 10. Two or more of these methods may be performed simultaneously. Furthermore, it is preferable that the limited current in a program operation be set by the driver 25.

The selection circuit 23 shown in FIG. 10 may be used in semiconductor devices other than programmable logic devices, for example large-capacity file memory devices including resistive change memory elements, or memory devices including resistive change memory elements together with logic circuits. The ratio of defective memory elements in the chip cannot be ignored in the above devices. Therefore, it is desirable that the chip including defective memory elements be made to be used by the redundancy techniques.

As described above, according to the second embodiment and its modifications, reconfigurable circuits capable of reducing the defective fraction of the chip can be provided.

Third Embodiment

Figure 11:
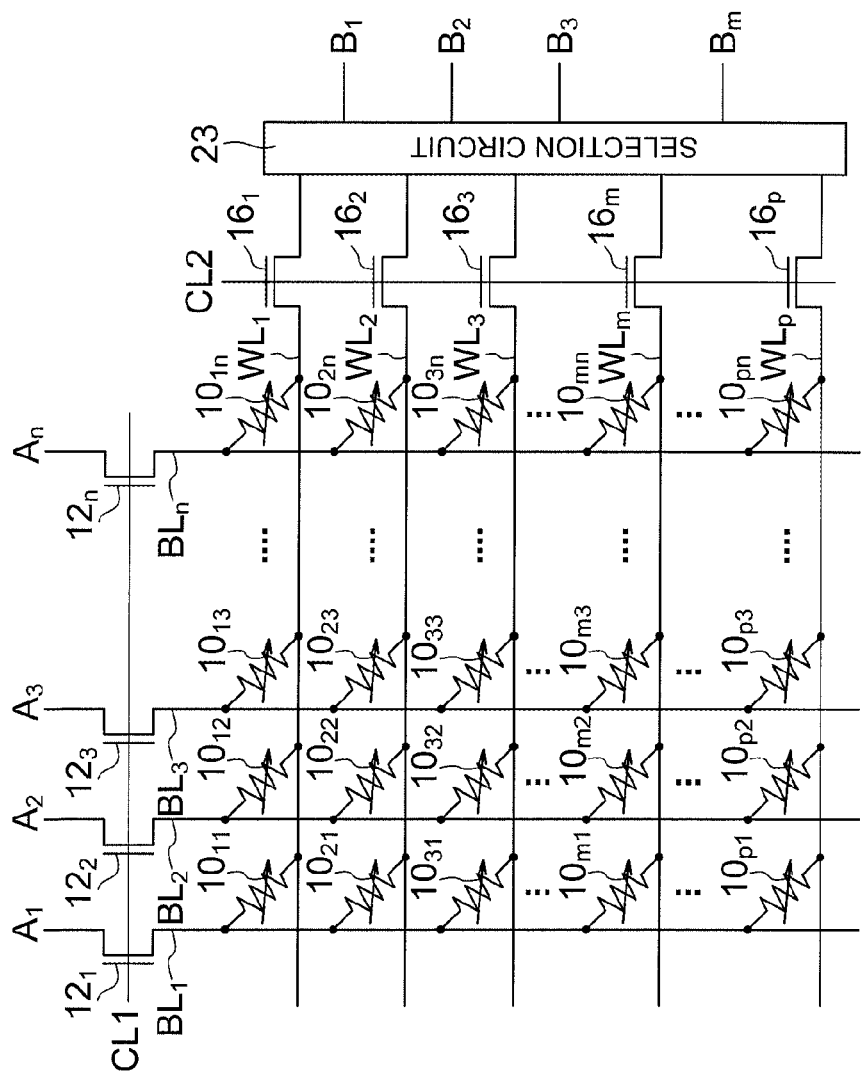
FIG. 11 is a circuit diagram showing a reconfigurable circuit according to a third embodiment.

FIG. 11 shows a reconfigurable circuit according to a third embodiment. The reconfigurable circuit according to the third embodiment is obtained by applying the selection circuit shown in FIG. 10 to a large-capacity file memory device or memory device including resistive change memory elements together with logic circuits.

The reconfigurable circuit according to the third embodiment includes p word lines $WL_i$ ($1 \le i \le p$, where m<p), n bit lines $BL_j$ ($1 \le j \le n$), and memory elements $10_{ij}$ disposed at intersections of the word lines and the bit lines. The word lines $WL_i$ ($1 \le i \le p$) are connected to a selection circuit 23 via transistors $16_i$. The selection circuit 23 selects m word lines from the p word lines $WL_i$ ($1 \le i \le p$). The selected m word lines are connected to m wiring lines $B_1, \ldots, B_m$ extending in the row direction, respectively.

The bit lines $BL_j$ ($1 \le j \le n$) are connected n wiring lines $A_j$ extending in a column direction via transistors $12_j$. The transistors $12_j$ between the bit lines $BL_j$ ($1 \le j \le n$) and the wiring lines $A_j$, and the transistors $16_i$ between the word lines $WL_i$ ($1 \le i \le p$) and the selection circuit 23 may be omitted. However, the presence of these transistors may prevent damage to peripheral circuits such as the selection circuit 23 caused by the set voltage or reset voltage when a memory element is programmed.

If the memory elements $10_{ij}$ ($1 \leq i \leq p$, $1 \leq j \leq n$) of the reconfigurable circuit according to the third embodiment shown in FIG. 11 includes a defective bit, the selection circuit 23 controls the connection of the wiring lines so that the word lines other than the one to which the defective bit is connected are connected to the wiring lines $B_1, \ldots, B_m$. For example, if the memory elements of the circuit shown in FIG. 11 includes no defective bit, the selection circuit 23 may select the word lines $WL_1, \ldots, WL_m$. If, for example, the memory element $10_{23}$ is a defective bit, the selection circuit 23 may select the word lines $WL_1, WL_3, \ldots, WL_m$, $WL_{m+1}$. This enables the circuit to operate without using the memory element $10_{23}$ but using only normal memory elements.

Although the selection circuit 23 is disposed to connect to the word lines in the third embodiment shown in FIG. 11, the selection circuit 23 may be disposed to connect to the bit lines.

As described above, according to the third embodiment, a reconfigurable circuit capable of reducing the defective fraction of the chip can be provided.

Fourth Embodiment

Figure 12:
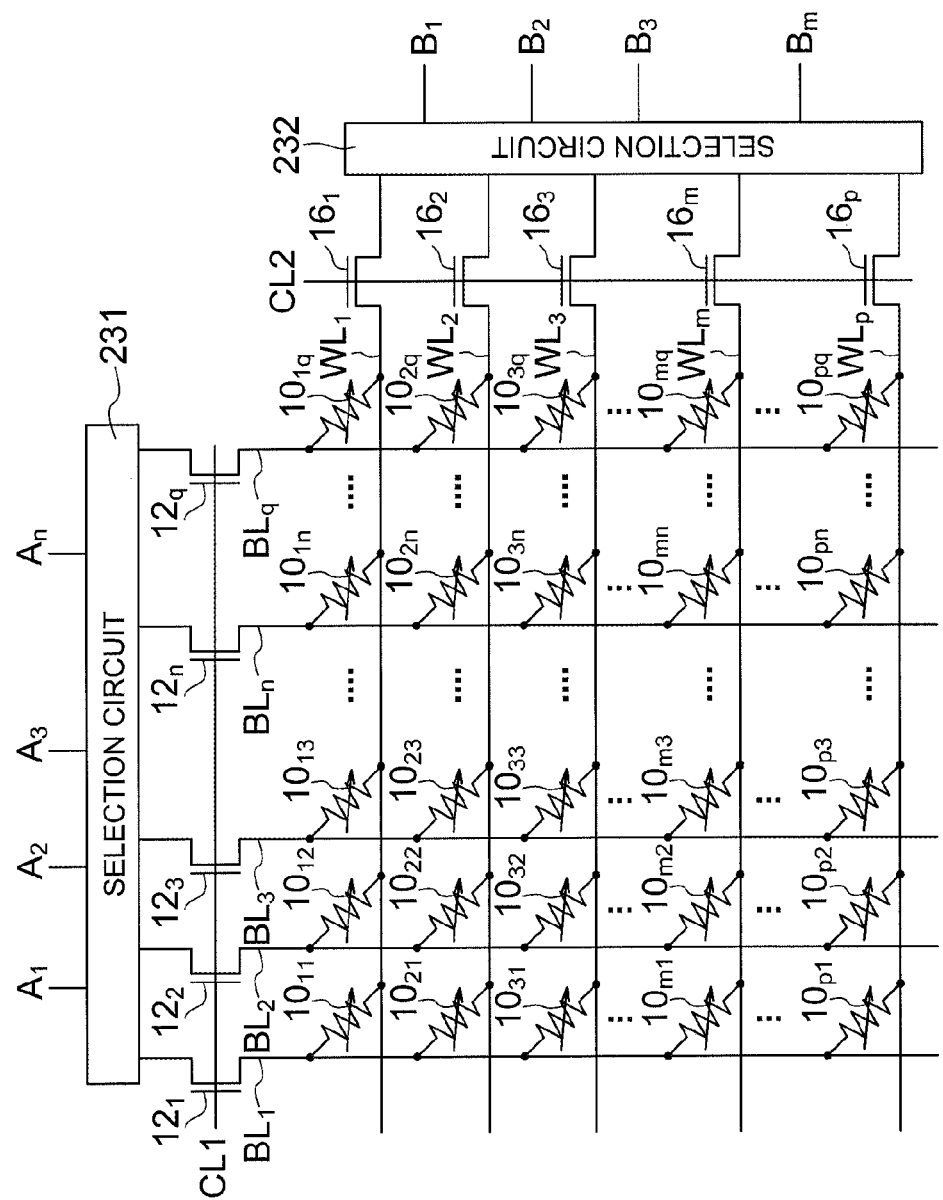
FIG. 12 is a circuit diagram showing a reconfigurable circuit according to a fourth embodiment.

FIG. 12 shows a reconfigurable circuit according to a fourth embodiment. The reconfigurable circuit according to the fourth embodiment includes p word lines $WL_i$ ($1 \leq i \leq p$, where m<p), q bit lines $BL_j$ ($1 \leq j \leq q$, where n<q), memory elements $10_{ij}$, and selection circuits 231, 232. The word lines $WL_i$ ($1 \leq i \leq p$) are connected to the selection circuit 232 via transistors $16_i$. The selection circuit 232 selects m word lines from the p word lines. The selected m word lines are connected to m wiring lines $B_1, \ldots, B_m$ extending in a row direction.

The bit lines $BL_j$ ($1 \leq j \leq q$) are connected to the selection circuit 231 via transistors $12_j$. The selection circuit 231 selects n bit lines from the q bit lines. The selected n bit lines are connected to n wiring lines $A_1, \ldots, A_n$. The transistors $12_j$ between the bit lines $BL_j$ ($1 \leq j \leq q$) and the selection circuit 231, and the transistors $16_i$ between the word lines $WL_i$ ($1 \leq i \leq p$) and the selection circuit 232 may be omitted. However, the presence of these transistors may prevent damage to peripheral circuits such as the selection circuits 231, 232 caused by the set voltage or reset voltage when a memory element is programmed.

If the memory elements $10_{ij}$ ($1 \leq i \leq p$, $1 \leq j \leq q$) of the reconfigurable circuit according to the fourth embodiment shown in FIG. 12 includes a defective bit, the selection circuit 232 controls the connection of the wiring lines so that the word lines other than the one connecting to the defective bit are connected to wiring lines $B_1, \ldots, B_m$, respectively. The selection circuit 231 may also control the connection of the wiring lines so that the bit lines other than the one connecting to the defective bit are connected to wiring lines $A_1, \ldots, A_m$, respectively. Thus, even if two or more memory elements are defective, the chip may be used if the selection circuits 231, 232 and redundant memory elements are provided in both the row direction and the column direction.

As described above, according to the fourth embodiment, a reconfigurable circuit capable of reducing the defective fraction in the chip can be provided.

Fifth Embodiment

A reconfigurable circuit according to a fifth embodiment will be described below.

If a reconfigurable circuit is applied to large-capacity file memory devices or memory devices including resistive change memory elements together with logic circuits, a rectifier element such as a diode is preferably connected in series to each memory element. The rectifier element here means an element with a resistance that is variable depending on the direction of the voltage applied thereto, or the magnitude of the voltage applied thereto. Such elements can be achieved by employing a structure in which a p-type semiconductor and an n-type semiconductor are in contact with each other, a structure in which a metal with a large work function and an n-type semiconductor are in contact with each other, a structure in which a metal with a small work function and a p-type semiconductor are in contact with each other, and a structure in which an insulating material is sandwiched by two metals. The aforementioned rectifier elements have a function of preventing read errors and write errors caused by a current flowing through an unexpected path in a read operation or write operation of a memory element. A reconfigurable circuit having such a structure will be described as the fifth embodiment below.

Figure 13:
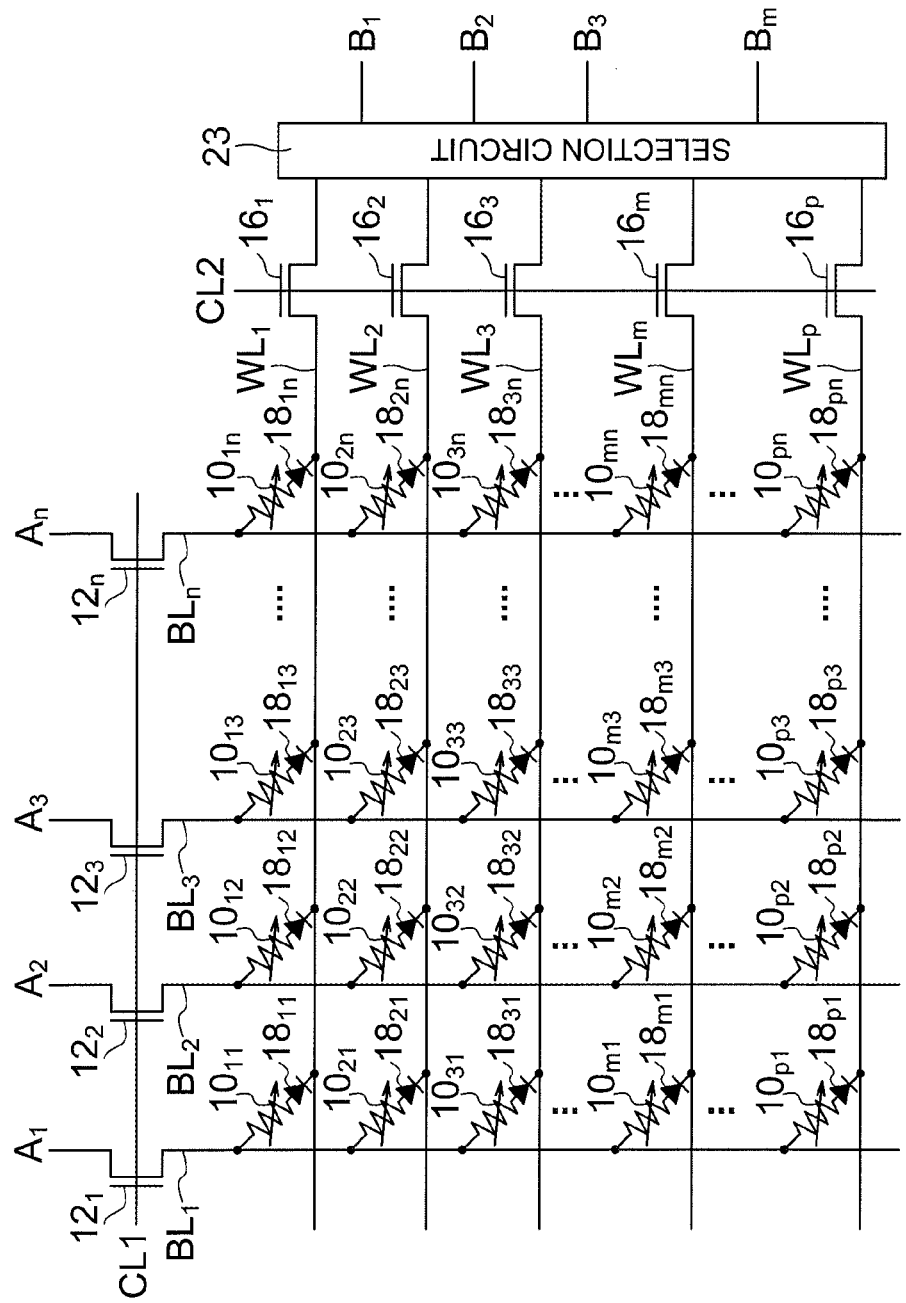
FIG. 13 is a circuit diagram showing a reconfigurable circuit according to a fifth embodiment.

FIG. 13 shows a reconfigurable circuit according to the fifth embodiment. The reconfigurable circuit according to the fifth embodiment is obtained by connecting rectifier elements $18_{ij}$ in series with the respective memory elements $10_{ij}$ ($1 \leq i \leq p$, $1 \leq j \leq n$) in the reconfigurable circuit according to the third embodiment shown in FIG. 11. Although each rectifier element is disposed between a memory element and a word line here, it may be disposed between the memory element and a bit line. The direction of the rectifier element may be opposite to that shown in FIG. 13.

Sixth Embodiment

Figure 14:
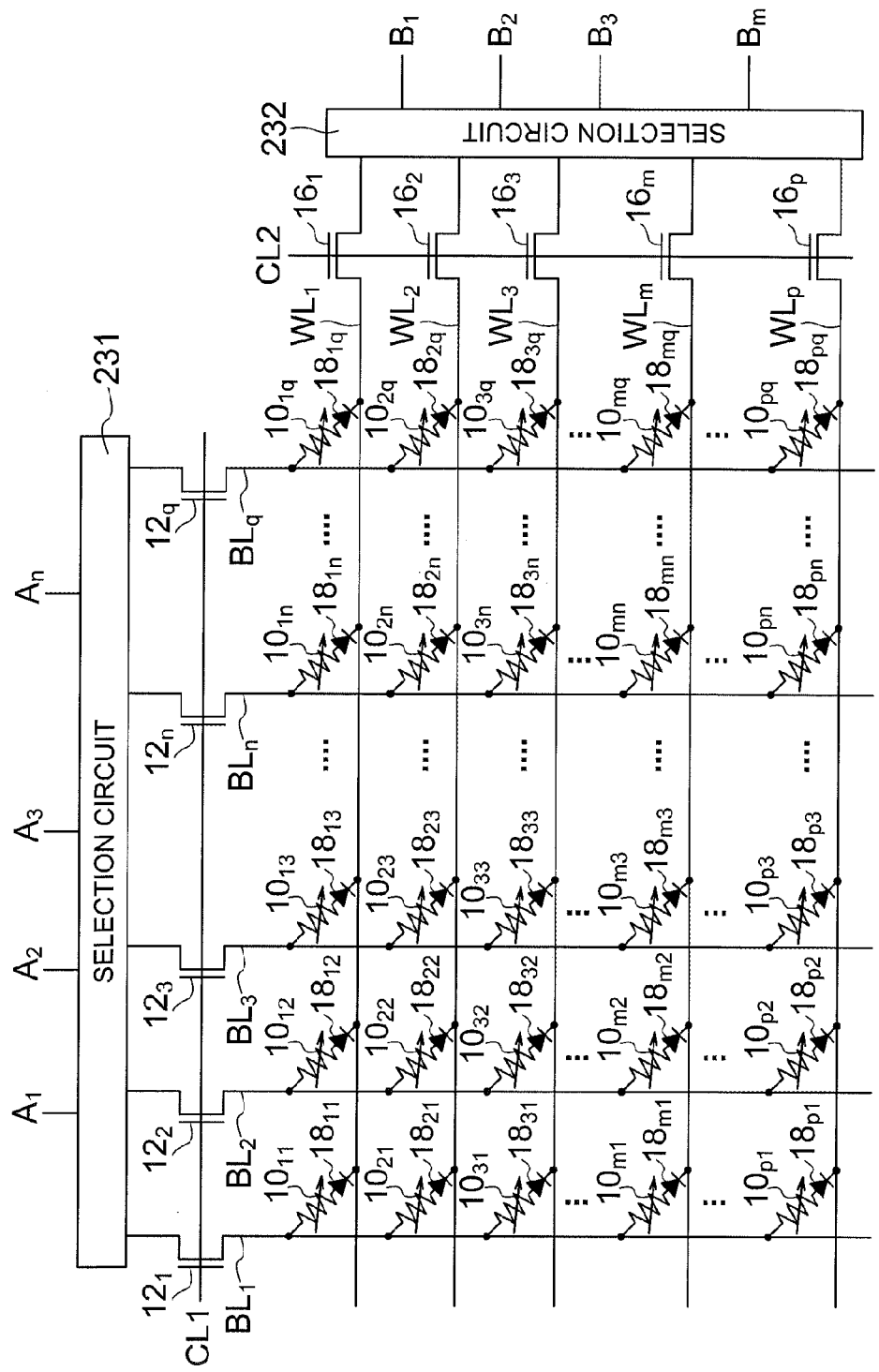
FIG. 14 is a circuit diagram showing a reconfigurable circuit according to a sixth embodiment.

FIG. 14 shows a reconfigurable circuit according to a sixth embodiment. The reconfigurable circuit according to the sixth embodiment is obtained by connecting rectifier elements $18_{ij}$ in series with the respective memory elements $10_{ij}$ ($1 \leq i \leq p$, $1 \leq j \leq q$) in the reconfigurable circuit according to the fourth embodiment shown in FIG. 12. Although each rectifier element is disposed between a memory element and a word line here, it may be disposed between the memory element and a bit line. The direction of the rectifier element may be opposite to that shown in FIG. 14.

Like the reconfigurable circuits according to the third and fourth embodiments shown in FIGS. 11 and 12, the chips of the reconfigurable circuits according to the fifth and sixth embodiments shown in FIGS. 13 and 14 may operate normally even if the memory elements include a defective bit by using other memory elements than the one with the defective bit.

Figure 15:
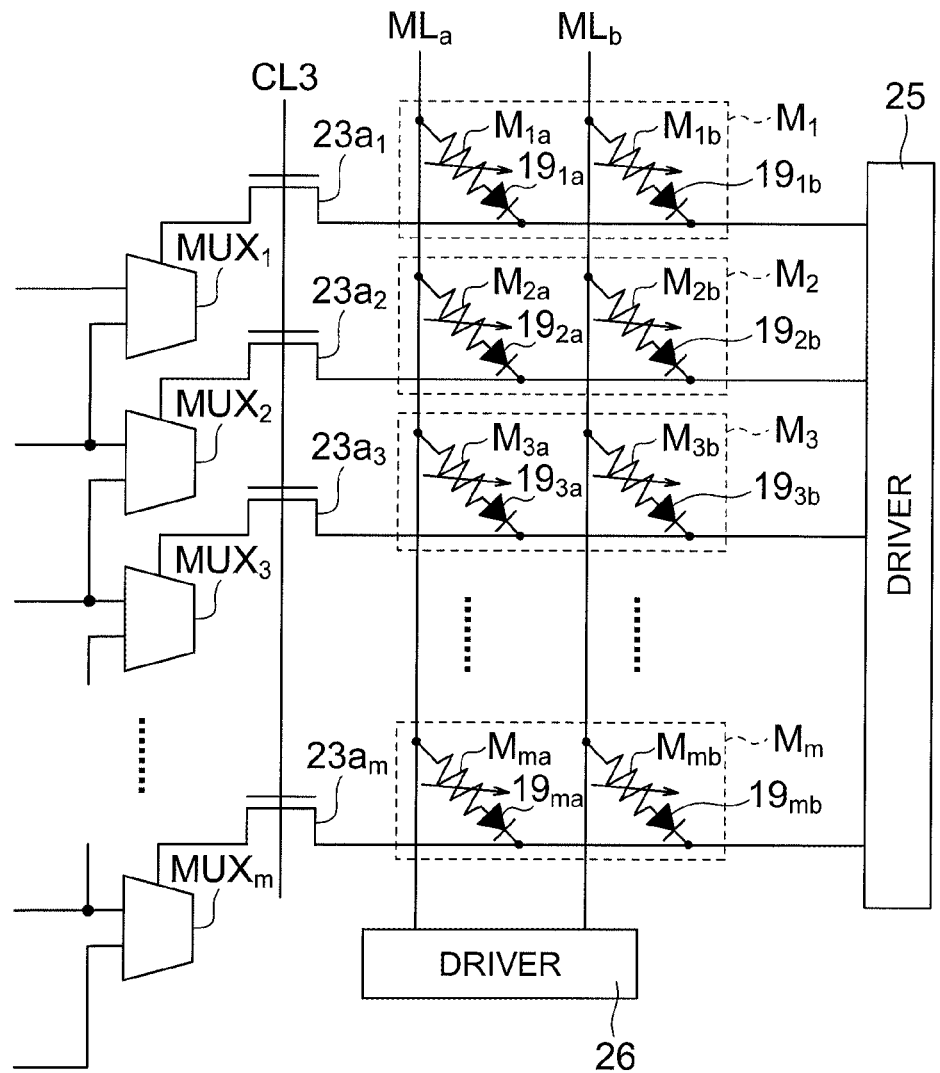
FIG. 15 is a circuit diagram showing an example of a selection circuit included in a reconfigurable circuit according to a modification of the fifth embodiment or sixth embodiment.

If a rectifier element is connected in series with each memory element in a memory array as shown in FIGS. 13 and 14, the structure of the memory elements $M_{ia}$, $M_{ib}$ that does not include any rectifier element as shown in FIG. 10 may be employed in the memory elements of the selection memories $M_i$ ($1 \leq i \leq m$) of the selection circuits 23, 231, 232. Alternatively, the memory elements $M_{ia}$, $M_{ib}$ may be connected to rectifier elements $19_{ma}$, $19_{mb}$ in the selection memories $M_i$ ($1 \leq i \leq m$) as in a modification shown in FIG. 15. In the former case, the voltage inputted to the wiring lines $ML_a$, $ML_b$ may be promptly transferred to the selection terminals of the multiplexers $MUX_i$ ($1 \leq i \leq m$). In the latter case, the manufacturing process may be simplified since it is not necessary to produce both the memory elements connected to the rectifier elements, and the memory elements not connected to the rectifier elements.

As described above, according to the fifth and sixth embodiments, reconfigurable circuits capable of reducing the defective fraction of the chips can be provided.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor integrated circuit comprising:
   N ($\geq 1$) input wiring lines, N being an integer number;
   M ($\geq 1$) output wiring lines, M being an integer number;
   N first wiring lines corresponding to the N input wiring lines, each of the first wiring lines connecting to a corresponding input wiring line;
   K ($>M$) second wiring lines crossing the N first wiring lines, K being an integer number;
   a plurality of first resistive change elements disposed at intersections of the first wiring lines and the second wiring lines, each of the first resistive change elements including a first electrode connecting to a corresponding one of the first wiring lines, a second electrode connecting to a corresponding one of the second wiring lines, and a first resistive change layer disposed between the first electrode and the second electrode;
   a first controller configured to control a voltage applied to the first wiring lines;
   a second controller configured to control a voltage applied to the second wiring lines, and the second controller including a current limitation circuit configured to limit a current flowing through the second wiring lines; and
   a selection circuit disposed between the output wiring lines and the second wiring lines to select M second wiring lines from the K second wiring lines, and to connect the selected M second wiring lines to the output wiring lines.

2. The circuit according to claim 1, wherein:
   the selection circuit includes M multiplexers corresponding to the M output wiring lines, each of the M multiplexers including a plurality of first input terminals and a first output terminal, and selection memories each corresponding to one of the M multiplexers and storing information to select any of the first input terminals; and
   each first input terminal of each multiplexer is connected to one of the second wiring lines, and the first output terminal of each multiplexer is connected to a corresponding one of the output wiring lines.

3. The circuit according to claim 1, wherein:
   K is equal to M+1;
   the K second wiring lines are first to (M+1)-th second wiring lines;
   the selection circuit includes first to M-th multiplexers corresponding to the M output wiring lines, each multiplexer including first and second input terminals and a first output terminal, and selection memories each corresponding to one of the multiplexers, each selection memory storing information to select one of the first input terminal and the second input terminal; and
   the first input terminal of an i-th (i=1, ..., M) multiplexer is connected to an i-th second wiring line, the second input terminal thereof is connected to an (i+1)-th second wiring line, and the first output terminal is connected to a corresponding one of the output wiring lines.

4. The circuit according to claim 1, wherein a resistive state between the first electrode and the second electrode being programmable from one of a low-resistance state and a high-resistance state to the other,
   when the resistive state between the first electrode and the second electrode of a predetermined first resistive change element is changed from the high-resistance state to the low-resistance state:
   the first controller applies a first voltage to one of the first wiring lines connecting to the first electrode of the predetermined first resistive change element, and a second voltage to the other first wiring lines;
   the second controller applies a third voltage to one of the second wiring lines connecting to the second electrode of the predetermined first resistive change element, and a fourth voltage to at least one of the other second wiring lines; and
   a value of the second voltage and a value of the fourth voltage are between a value of the first voltage and a value of the third voltage.

5. A semiconductor integrated circuit comprising:
   N ($\geq 1$) input wiring lines, N being an integer number;
   M ($\geq 1$) output wiring lines, M being an integer number;
   N first wiring lines corresponding to the N input wiring lines, each of the first wiring lines connecting to a corresponding input wiring line;
   K ($>M$) second wiring lines crossing the N first wiring lines, K being an integer number;
   a plurality of first resistive change elements disposed at intersections of the first wiring lines and the second wiring lines, each of the first resistive change elements including a first electrode connecting to a corresponding one of the first wiring lines, a second electrode connecting to a corresponding one of the second wiring lines, and a first resistive change layer disposed between the first electrode and the second electrode;
   a first controller configured to control a voltage applied to the first wiring lines;
   a second controller configured to control a voltage applied to the second wiring lines;
   a selection circuit disposed between the output wiring lines and the second wiring lines to select M second wiring lines from the K second wiring lines, and to connect the selected M second wiring lines to the output wiring lines, the selection circuit including:
   a plurality of second resistive change elements, each including a third electrode, a fourth electrode, and a second resistive change layer disposed between the third electrode and the fourth electrode;
   a third controller configured to control a voltage applied to the third electrode of each second resistive change element; and
   a fourth controller configured to control a voltage applied to the fourth electrode of each second resistive change element.

6. The circuit according to claim 5, wherein the second controller includes a current limitation circuit configured to limit a current flowing through the second wiring lines.

7. The circuit according to claim 5, wherein a resistive state between the first electrode and the second electrode being programmable from one of a low-resistance state and a high-resistance state to the other and a resistive state between the third electrode and the fourth electrode being programmable from one of a low-resistance state and a high-resistance state to the other, when the resistive state between the first electrode and the second electrode of a predetermined first resistive change element is changed from the high-resistance state to the low-resistance state:

the first controller applies a first voltage to one of the first wiring lines connecting to the first electrode of the predetermined first resistive change element; and the second controller applies a second voltage to one of the second wiring lines connecting to the second electrode of the predetermined first resistive change element, and when the resistive state between the third electrode and the fourth electrode of a predetermined second resistive change element is changed from the high-resistance state to the low-resistance state:

the third controller applies a third voltage to the third electrode of the predetermined second resistive change element; and the fourth controller applies a fourth voltage to the fourth electrode of the predetermined second resistive change element.

8. The circuit according to claim 7, wherein a difference between the third voltage and the fourth voltage is greater than a difference between the first voltage and the second voltage.

9. The according to claim 7, wherein a period of time during which the third controller applies the third voltage is longer than a period of time during which the first controller applies the first voltage, and a period of time during which the fourth controller applies the fourth voltage is longer than a period of time during which the second controller applies the second voltage.

10. The circuit according to claim 7, wherein:

when the resistive state between the first electrode and the second electrode of the predetermined first resistive change element is programmed from the high-resistance state to the low-resistance state, the second controller limits a value of a current flowing through the first resistive change element to be equal to or less than a first current value; and when the resistive state between the third electrode and the fourth electrode of the predetermined second resistive change element is programmed from the high-resistance state to the low-resistance state, one of the third controller and the fourth controller limits a value of a current flowing through the second resistive change element to be equal to or less than a second current value that is higher than the first current value.

11. The circuit according to claim 7, wherein the third controller and the fourth controller irreversibly change the resistive state between the third electrode and the fourth electrode of the predetermined second resistive change element from the high-resistance state to the low-resistance state.

12. The according to claim 5, wherein the first electrode is formed of the same material as the third electrode, or the second electrode is formed of the same material as the fourth electrode, or the first resistive change layer is formed of the same material as the second resistive change layer.

13. A semiconductor integrated circuit comprising:

N ($\geq 1$) input wiring lines, N being an integer number;

M ($\geq 1$) output wiring lines, M being an integer number;

N first wiring lines corresponding to the N input wiring lines, each of the first wiring lines connecting to a corresponding input wiring line;

K (>M) second wiring lines crossing the N first wiring lines, K being an integer number;

a plurality of first resistive change elements disposed at intersections of the first wiring lines and the second wiring lines, each of the first resistive change elements including a first electrode connecting to a corresponding one of the first wiring lines, a second electrode connecting to a corresponding one of the second wiring lines, and a first resistive change layer disposed between the first electrode and the second electrode;

a first controller configured to control a voltage applied to the first wiring lines;

a second controller configured to control a voltage applied to the second wiring lines;

a selection circuit disposed between the output wiring lines and the second wiring lines to select M second wiring lines from the K second wiring lines, and to connect the selected M second wiring lines to the output wiring lines, the selection circuit including:

M multiplexers corresponding to the M output wiring lines, each of the M multiplexers including a plurality of input terminals and an output terminal;

selection memories each corresponding to one of the M multiplexers and storing information to select any of the input terminals, each selection memory including a plurality of second resistive change elements, each of which includes a third electrode, a fourth electrode, and a second resistive change layer disposed between the third electrode and the fourth electrode;

a third controller configured to control a voltage applied to the third electrode of each second resistive change element; and a fourth controller configured to control a voltage applied to the fourth electrode of each second resistive change element, each of the input terminals of each multiplexer connecting to one of the second wiring lines, and the output terminal thereof connecting to a corresponding one of the output wiring lines.

14. The circuit according to claim 13, wherein the second controller includes a current limitation circuit configured to limit a current flowing through the second wiring lines.

15. The circuit according to claim 13, wherein a resistive state between the first electrode and the second electrode being programmable from one of a low-resistance state and a high-resistance state to the other, and a resistive state between the third electrode and the fourth electrode being programmable from one of a low-resistance state and a high-resistance state to the other, when the resistive state between the first electrode and the second electrode of a predetermined first resistive change element is changed from the high-resistance state to the low-resistance state:

the first controller applies a first voltage to one of the first wiring lines connecting to the first electrode of the predetermined first resistive change element; and the second controller applies a second voltage to one of the second wiring lines connecting to the second electrode of the predetermined first resistive change element, and when the resistive state between the third electrode and the fourth electrode of a predetermined second resistive change element is changed from the high-resistance state to the low-resistance state:

the third controller applies a third voltage to the third electrode of the predetermined second resistive change element; and the fourth controller applies a fourth voltage to the fourth electrode of the predetermined second resistive change element.

16. The circuit according to claim 15, wherein a difference between the third voltage and the fourth voltage is greater than a difference between the first voltage and the second voltage.

17. The circuit according to claim 15, wherein a period of time during which the third controller applies the third voltage is longer than a period of time during which the first controller applies the first voltage, and a period of time during which the fourth controller applies the fourth voltage is longer than a period of time during which the second controller applies the second voltage.

18. The circuit according to claim 15, wherein:

when the resistive state between the first electrode and the second electrode of the predetermined first resistive change element is programmed from the high-resistance state to the low-resistance state, the second controller limits a value of a current flowing through the first resistive change element to be equal to or less than a first current value; and when the resistive state between the third electrode and the fourth electrode of the predetermined second resistive change element is programmed from the high-resistance state to the low-resistance state, one of the third controller and the fourth controller limits a value of a current flowing through the second resistive change element to be equal to or less than a second current value that is higher than the first current value.

19. The circuit according to claim 15, wherein the third controller and the fourth controller irreversibly change the resistive state between the third electrode and the fourth electrode of the predetermined second resistive change element from the high-resistance state to the low-resistance state.

* * * * *